(12) United States Patent
Xie et al.

(10) Patent No.: US 8,442,472 B2
(45) Date of Patent: May 14, 2013

(54) TECHNIQUE TO GENERATE DIVIDE BY TWO AND 25% DUTY CYCLE

(75) Inventors: Haolu Xie, Chandler, AZ (US); Manish N. Shah, Chandler, AZ (US)

(73) Assignee: Fujitsu Semiconductor Limited, Yokohama-shi (JP)

( * ) Notice: Subject to any disclaimer, the term of this patent is extended or adjusted under 35 U.S.C. 154(b) by 225 days.

(21) Appl. No.: 13/079,516

(22) Filed: Apr. 4, 2011

(65) Prior Publication Data

US 2012/0252393 A1 Oct. 4, 2012

(51) Int. Cl.
*H03B 19/00* (2006.01)
*H04B 1/40* (2006.01)

(52) U.S. Cl.
USPC .................. 455/318; 455/323; 327/117

(58) Field of Classification Search .................. 455/313, 455/315, 318, 319, 323; 327/115, 117, 118
See application file for complete search history.

(56) References Cited

U.S. PATENT DOCUMENTS

| | | | |
|---|---|---|---|
| 5,987,089 A | 11/1999 | Hawkings, Jr. | 377/47 |
| 6,133,796 A * | 10/2000 | Monk | 331/16 |
| 6,278,307 B1 * | 8/2001 | El-Kik | 327/175 |
| 6,566,918 B1 * | 5/2003 | Nguyen | 327/115 |
| 7,505,548 B2 * | 3/2009 | Scuteri | 377/47 |
| 7,612,592 B2 | 11/2009 | Parikh | 327/175 |
| 7,821,315 B2 | 10/2010 | Bossu et al. | 327/175 |

OTHER PUBLICATIONS

Wagh; "You want latches? We got latches / Flip-Flop Design"; Circuit Design; http://circuitdesign.info/ . . . /you-want-latches- . . . ; pp. 6, Feb. 21, 2001.

* cited by examiner

*Primary Examiner* — Blane J Jackson
(74) *Attorney, Agent, or Firm* — Baker Botts L.L.P.

(57) ABSTRACT

A frequency divider with a twenty-five percent duty cycle is disclosed. A frequency divider may include an input configured to receive a clock signal, each cycle of the clock signal including a first phase and a second phase, a plurality of latches, and a plurality of three-state circuits wherein a first of the plurality of three-state circuits is configured to drive a first twenty-five percent duty cycle signal from within the first three-state circuit high during a first phase of a first of two clock cycles.

22 Claims, 6 Drawing Sheets

TECHNIQUE TO GENERATE DIVIDE BY TWO AND 25% DUTY CYCLE

TECHNICAL FIELD

The present disclosure relates generally to wireless communication and, more particularly, to local oscillator circuits in wireless communication devices.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal. On the other hand, a receiver is an electronic device which, also usually with the aid of an antenna, receives and processes a wireless electromagnetic signal. In certain instances, a transmitter and receiver may be combined into a single device called a transceiver.

Transmitters, receivers, and transceivers often include components known as oscillators. An oscillator may serve many functions in a transmitter, receiver, and/or transceiver, including generating a local oscillator signal (usually in a radio-frequency range) for upconverting baseband signals onto a radio-frequency (RF) carrier and performing modulation for transmission of signals, and/or for downconverting RF signals to baseband signals and performing demodulation of received signals.

In many instances, oscillators may include a crystal resonator and may be tuned to a specific frequency. However, specific functions in wireless communication devices may require a modified oscillator signal. For example, an upconverter or a downconverter may require an oscillator signal at a lower frequency than provided by the crystal resonator. Similarly, and upconverter or a downconverter may require an oscillator signal with a modified duty cycle. Digital circuitry may accompany an oscillator in order to provide such a modified signal. However, any additional circuitry used to modify the oscillator signal will result in undesired power consumption when in use.

SUMMARY

In accordance with some embodiments of the present disclosure, a frequency divider may include an input configured to receive a clock signal, each cycle of the clock signal including a first phase and a second phase, a plurality of latches, and a plurality of three-state circuits wherein a first of the plurality of three-state circuits is configured to drive a first twenty-five percent duty cycle signal from within the first three-state circuit high during a first phase of a first of two clock cycles.

Technical advantages of one or more embodiments of the present disclosure may include the generation of a twenty-five percent duty cycle from directly within a frequency divider loop, thus avoiding the need for further current consuming circuitry to generate the twenty-five percent duty cycle independent of the frequency divider loop.

It will be understood that the various embodiments of the present disclosure may include some, all, or none of the enumerated technical advantages. In addition, other technical advantages of the present disclosure may be readily apparent to one skilled in the art from the figures, description and claims included herein.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
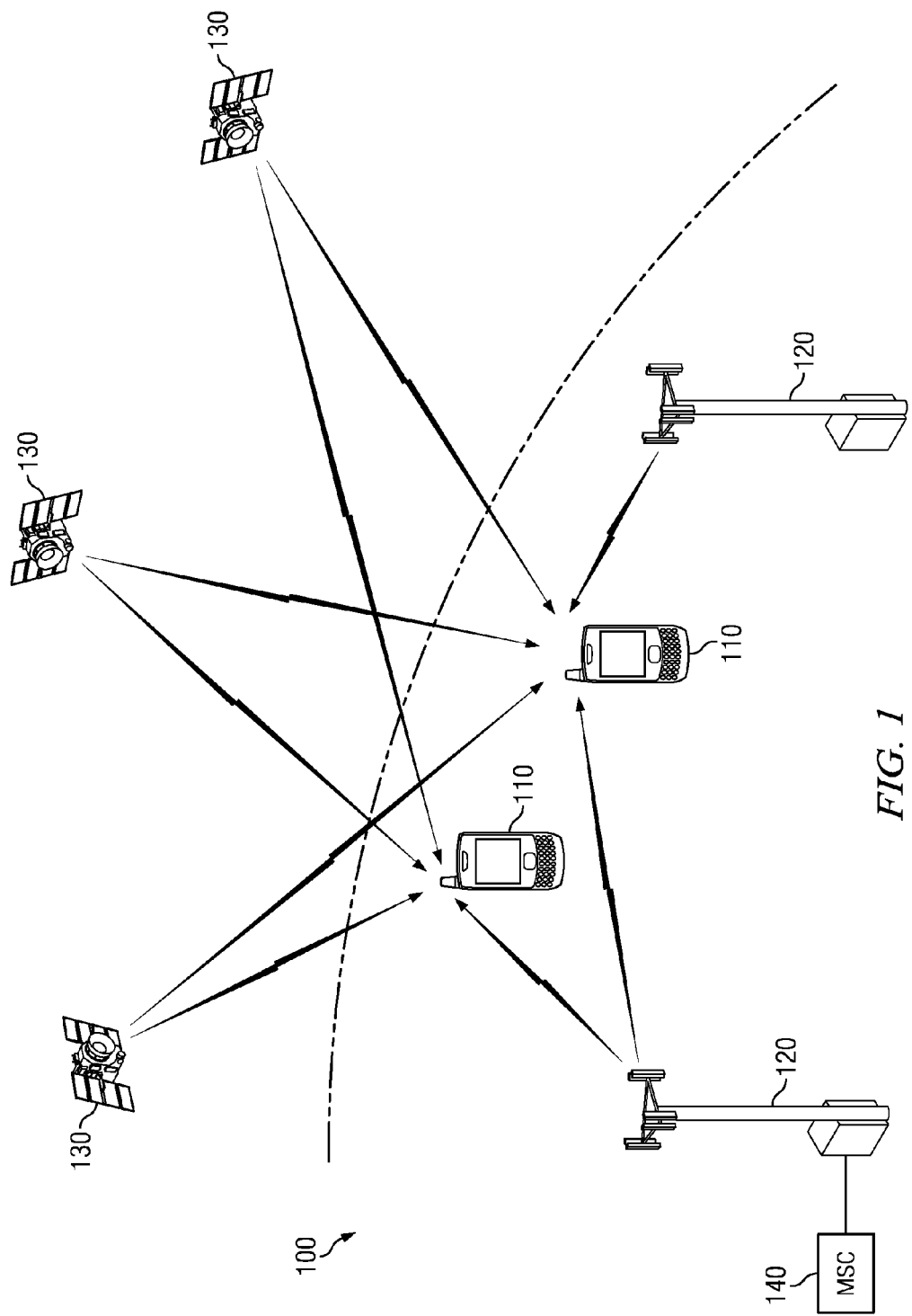
FIG. 1 illustrates a block diagram of an example wireless communication, in accordance with certain embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may or may not be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
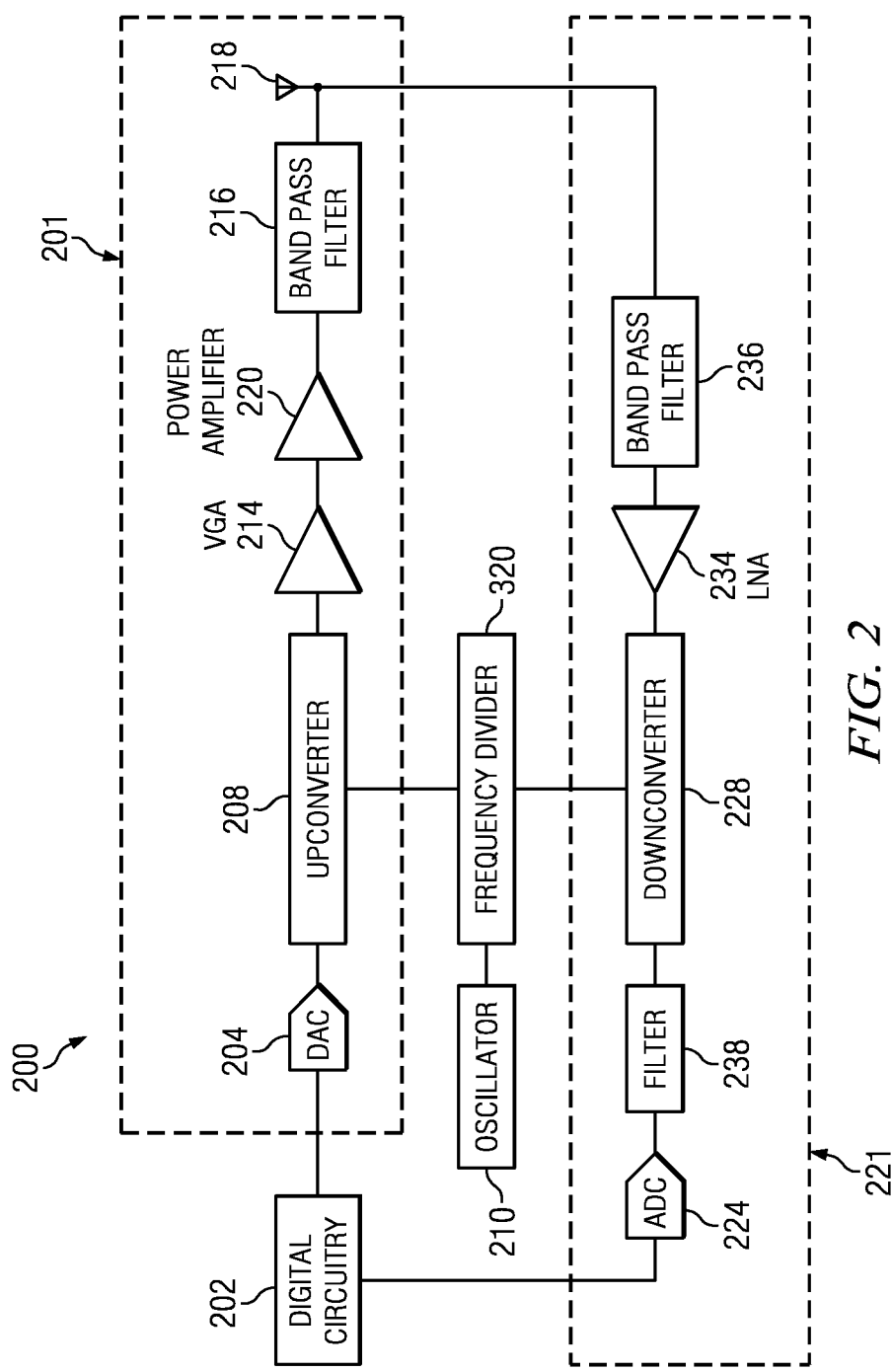
FIG. 2 illustrates a block diagram of selected components of an example transmitting and/or receiving element, in accordance with certain embodiments of the present disclosure.

FIG. 2 illustrates a block diagram of selected components of an example transmitting and/or receiving element 200 (e.g., a terminal 110, a base station 120, or a satellite 130), in accordance with certain embodiments of the present disclosure. Element 200 may include a transmit path 201 and/or a receive path 221. Depending on the functionality of element 200, element 200 may be considered a transmitter, a receiver, or a transceiver.

As depicted in FIG. 2, element 200 may include digital circuitry 202. Digital circuitry 202 may include any system, device, or apparatus configured to process digital signals and information received via receive path 221, and/or configured to process signals and information for transmission via transmit path 201. Such digital circuitry 202 may include one or more microprocessors, digital signal processors, and/or other suitable devices.

Transmit path 201 may include a digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208.

Upconverter 208 may be configured to frequency upconvert an analog signal received from DAC 204 to a wireless communication signal at a radio frequency based on an oscillator signal generated by oscillator 210 and modified by frequency divider 320.

Oscillator 210 may be any suitable device, system, or apparatus configured to produce an waveform for modulation or upconversion of an analog signal to a wireless communication signal, or for demodulation or downconversion of a wireless communication signal to an analog signal. In some embodiments, oscillator 210 may include a digitally-controlled crystal oscillator.

In some embodiments, oscillator 210 may generate a digital clock signal with a highly precise frequency. The clock signal may have a fifty-percent duty cycle, meaning that the signal is in a high state (e.g., logic 1) for approximately fifty percent of the time of each clock cycle and is in a low state (e.g., logic 0) for approximately fifty percent of the time of each clock cycle. For the purposes of the present disclosure, any definition of a duty cycle is only approximate. For example, a twenty-five percent duty cycle signal may describe an electrical signal with a high state during approximately twenty-five percent of the clock cycle time, including variances due to factors including but not limited to rise and fall times of the signal, clock jitter, temperature variation, and semiconductor processing variations.

Oscillator 210 may pass a clock signal to frequency divider 320. Frequency divider 320 may be any suitable device, system, or apparatus configured to divide the frequency of a clock signal to an appropriate frequency for use in upconversion or downconversion. For example, frequency divider 320 may divide the frequency of the clock signal by a factor of two and output a frequency-divided signal. Frequency divider 320 may also generate a frequency-divided output signal having a twenty-five percent duty.

Transmit path 201 may include a variable-gain amplifier (VGA) 214 to amplify an upconverted signal. The upconverted signal may be received by power amplifier 220 where it is further amplified for transmission. A bandpass filter 216 may receive the amplified signal, remove out-of-band noise and undesired signals, and pass signal components in the band of interest for transmission via antenna 218. Antenna 218 may receive the amplified and transmit such signal (e.g., to one or more of a terminal 110, a base station 120, and/or a satellite 130).

Receive path 221 may include a bandpass filter 236 configured to receive a wireless communication signal (e.g., from a terminal 110, a base station 120, and/or a satellite 130) via antenna 218. Bandpass filter 236 may pass signal components in the band of interest and remove out-of-band noise and undesired signals. In addition, receive path 221 may include a low-noise amplifier (LNA) 224 to amplify a signal received from bandpass filter 236.

Receive path 221 may also include a downconverter 228. Downconverter 228 may be configured to frequency downconvert a wireless communication signal received via antenna 218 and amplified by LNA 234 by an oscillator signal that is generated by oscillator 210 and modified by frequency divider 320 (e.g., downconvert to a baseband signal). Receive path 221 may further include a low pass filter 238, which may be configured to filter a downconverted wireless communication signal in order to pass the signal components within a radio-frequency channel of interest and/or to remove noise and undesired signals that may be generated by the downconversion process. In addition, receive path 221 may include an analog-to-digital converter (ADC) 224 configured to receive an analog signal from low pass filter 238 and convert such analog signal into a digital signal. Such digital signal may then be passed to digital circuitry 202 for processing.

Figure 3:
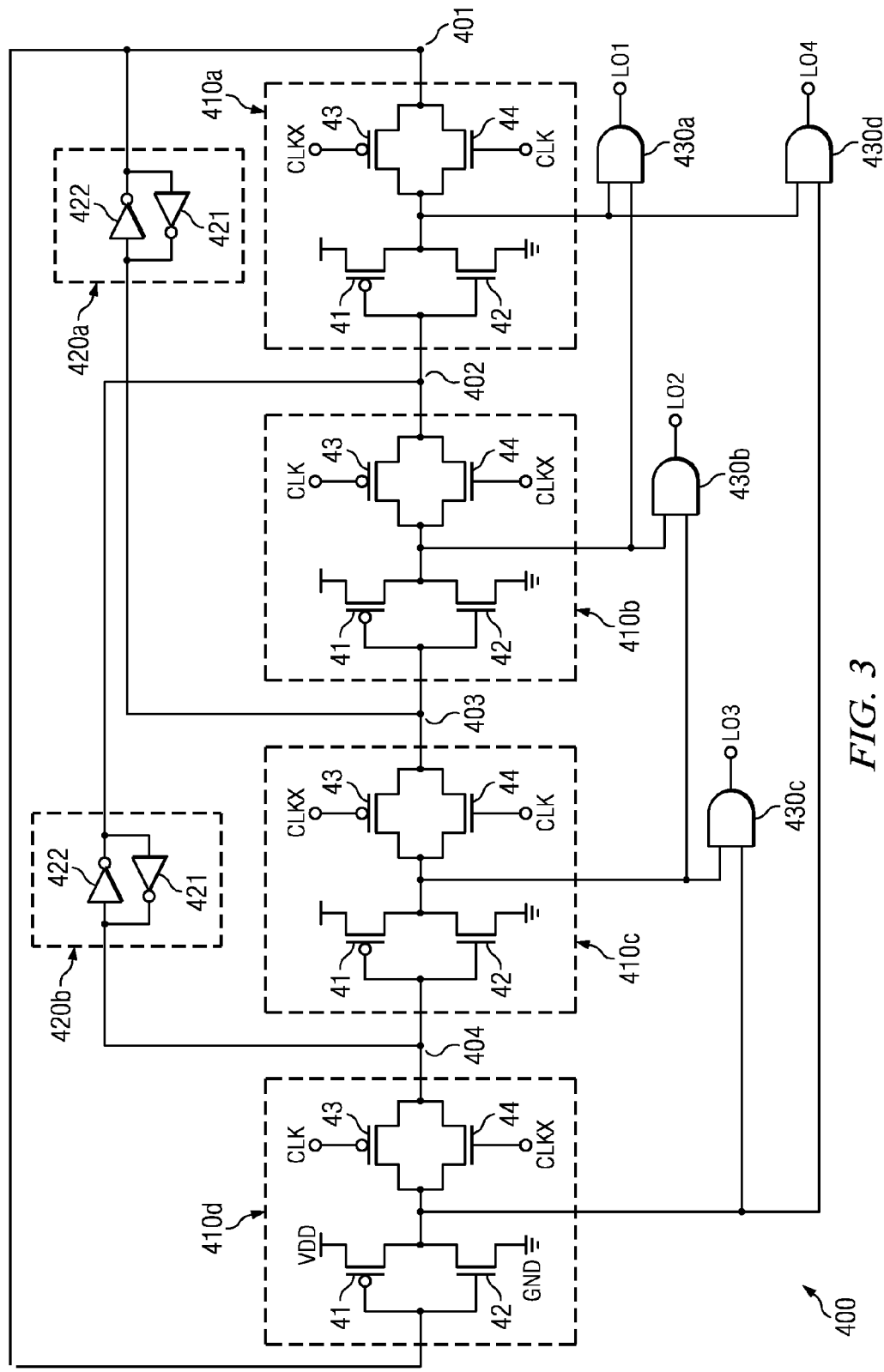
FIG. 3 illustrates a schematic diagram of a frequency divider, as is known in the art.

FIG. 3 illustrates a schematic diagram of a frequency divider 400 that provides a twenty-five percent duty cycle as is known in the art. Frequency divider 400 includes four three-state circuits 410*a-d*, two latches 420*a-b*, and four AND gates 430*a-d*. Three-state circuit 410*d* has a loop input coupled to the loop output of three-state circuit 410*a* at node 401. Three-state circuit 410*c* has a loop input coupled to the loop output of three-state circuit 410*d* at node 404. Three-state circuit 410*b* has a loop input coupled to the loop output of three-state circuit 410*c* at node 403. Three-state circuit 410*a* has a loop input coupled to the loop output of three-state circuit 410*b* at node 402. Latch 420*a* has a first terminal coupled to node 401 and a second terminal coupled to node 403, and latch 420*b* has a first terminal coupled to node 404 and a second terminal coupled to node 402.

As shown in FIG. 3, each of the three-state circuits 410*a-d* includes p-type metal-oxide semiconductor transistor (PMOS) 41, n-type metal-oxide semiconductor transistor (NMOS) 42, PMOS 43, and NMOS 44. PMOS 41 has a gate coupled to the loop input of the three-state circuit 410 and a source tied to a high potential power supply (VDD). NMOS 42 has a gate coupled to the loop input of the three-state circuit 410 and a source tied to a low potential power supply (GND). The drain of PMOS 41 and the drain of NMOS 42 are coupled together. PMOS 43 and NMOS 44 are configured as a transmission gate with their respective first conducting terminals coupled together and coupled to the drains of PMOS 41 and NMOS 42, and their respective second conducting terminals coupled together at the loop output of the three-state circuit 410. Three-state circuit 410 has three output states. Three-state circuit 410 may drive its loop output high when its loop input is low and PMOS 43 and NMOS 44 are on, it may drive the loop output low when its loop input is high and PMOS 43 and NMOS 44 are on, and it may force the loop output into a high impedance state when PMOS 43 and NMOS 44 are off.

Each latch 420 includes two cross-coupled inverters, inverter 421 and inverter 422. Latch 420 is configured to be subservient when the terminals of latch 420 are driven high or low by loop outputs of the respective three-state circuits 410 and to latch the states of the loop outputs of the three-state circuits when the respective three-state circuits are in high impedance mode. For example, inverters 421 and 422 may include semiconductor transistors which are sized to have low transconductances as compared to the PMOS 41, NMOS 42, PMOS 43, and NMOS 44 in three-state circuit 410. Thus, when three-state circuit 410 and latch 420 are driving a node in opposite directions, the three-state circuit 410 will be dominant and will flip the state of the latch 420 so that the latch is also driving the terminal in the same direction as the three-state circuit 410.

As shown in FIG. 3, the three-state circuits 410*a-d* are configured to receive a clock signal (CLK) and an inverted clock signal (CLKX). Three-state circuits 410*a* and 410*c* are configured to actively drive nodes 401 and 403 respectively during the first phase of the clock cycle, i.e., when CLK is high and CLKX is low, and to place their respective loop outputs into a high impedance state during the second phase of the clock cycle, i.e., when CLK is high and CLKX is low. On the other hand, three-state circuits 410*b* and 410*d* are configured to actively drive nodes 402 and 404 respectively during the second phase of the clock cycle, i.e., when CLK is low and CLKX is high, and to place their respective loop outputs into a high impedance state during the first phase of the clock cycle, i.e., when CLK is high and CLKX is low.

Figure 4:
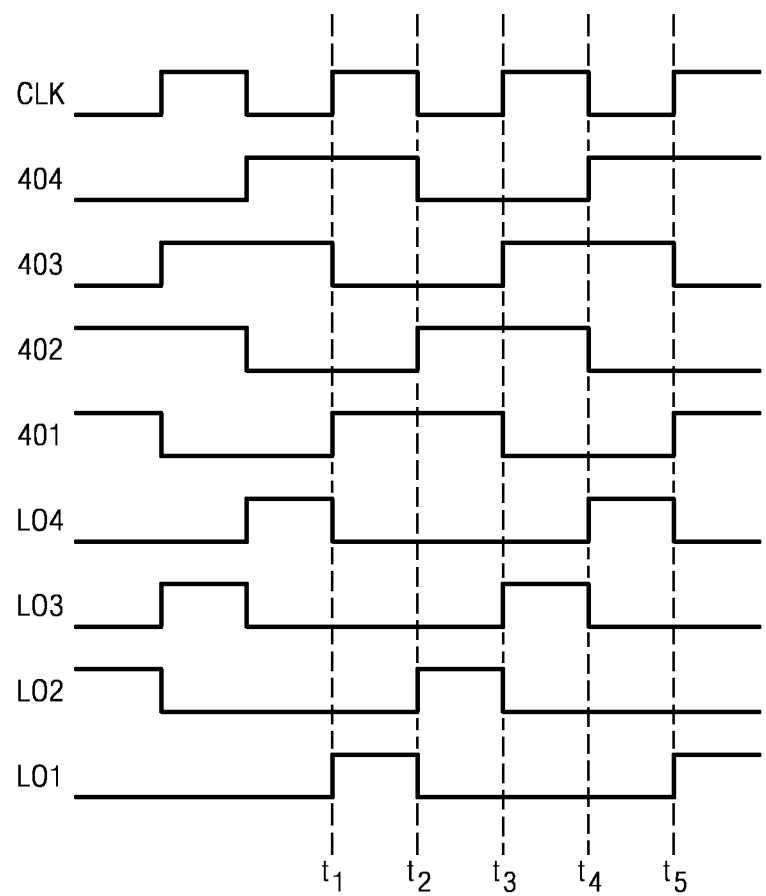
FIG. 4 illustrates a graph of example waveforms over time for selected signals at nodes of the frequency divider depicted in FIG. 3.

As illustrated by the selected waveforms in FIG. 4, the alternating driving and high impedance states of the four three-state circuits 410*a-d* connected in a loop will divide the frequency of the CLK signal at nodes 404, 403, 402, and 401.

When CLK goes high at time $t_1$, three-state circuits 410*d* and 410*b* will enter high impedance state, but the values at node 404 and 402 will be held steady by latch 420*b*. At this time, three-state circuit 410*c* will invert the high signal at node 404 and drive node 403 low, and three-state circuit 410*a* will invert the low signal at node 402 and drive node 401 high.

When CLK goes low at time $t_2$, three-state circuits 410*c* and 410*a* will enter high impedance state, but the values at node 403 and 401 will be held steady by latch 420*a*. At this time, three-state circuit 410*d* will invert the high signal at node 401 and drive node 404 low, and three-state circuit 410*b* will invert the low signal at node 403 and drive node 402 high.

When CLK goes high at time $t_3$, three-state circuits 410*d* and 410*b* will enter high impedance state, but the values at node 404 and 402 will be held steady by latch 420*b*. At this time, three-state circuit 410*a* will invert the high signal at node 402 and drive node 401 low, and three-state circuit 410*c* will invert the low signal at node 404 and drive node 403 high.

When CLK goes low at time $t_4$, three-state circuits 410*c* and 410*a* will enter high impedance state, but the values at node 403 and 401 will be held steady by latch 420*a*. At this time, three-state circuit 410*b* will invert the high signal at node 403 and drive node 402 low, and three-state circuit 410*d* will invert the low signal at node 401 and drive node 404 high.

At time $t_5$, the above described cycle for nodes 404, 403, 402, and 401, at times $t_1$-$t_4$ will begin to repeat itself.

As illustrated in FIG. 4, the respective loop outputs of each three-state circuit 410*a-d* have a phase shift of ninety degrees from their respective loop inputs. Accordingly, counting from node 401, node 402 is ninety degrees out of phase with node 401, node 403 is one-hundred and eighty degrees out of phase with node 401, and node 404 is two-hundred and seventy degrees out of phase with node 401.

As show in FIG. 3, AND gates 430*a-d* are each coupled to two successive three-state circuits out of the four three-state circuits 410*a-d* in the loop.

AND gate 430*a* has a first input coupled to the drains of PMOS 41 and NMOS 42 in three-state circuit 410*b*, a second input coupled to the drains of PMOS 41 and NMOS 42 in three-state circuit 410*a*, and an output driving a first local-oscillator signal (LO1). Accordingly, LO1 will be driven high only when both inputs to AND gate 430*a* are driven high, i.e., when both node 403 and 402 are low. Thus, LO1 will have a twenty-five percent duty cycle at a frequency that is half of the frequency of CLK.

AND gate 430*b* has a first input coupled to the drains of PMOS 41 and NMOS 42 in three-state circuit 410*c*, a second input coupled to the drains of PMOS 41 and NMOS 42 in three-state circuit 410*b*, and an output driving a second local-oscillator signal (LO2). Accordingly, LO2 will be driven high only when both inputs to AND gate 430*b* are driven high, i.e., when both node 404 and 403 are low. Thus, LO2 will have a twenty-five percent duty cycle at a frequency that is half of the frequency of CLK.

AND gate 430*c* has a first input coupled to the drains of PMOS 41 and NMOS 42 in three-state circuit 410*d*, a second input coupled to the drains of PMOS 41 and NMOS 42 in three-state circuit 410*c*, and an output driving a third local-oscillator signal (LO3). Accordingly, LO3 will be driven high only when both inputs to AND gate 430*c* are driven high, i.e., when both node 404 and 401 are low. Thus, LO3 will have a twenty-five percent duty cycle at a frequency that is half of the frequency of CLK.

AND gate 430*d* has a first input coupled to the drains of PMOS 41 and NMOS 42 in three-state circuit 410*a*, a second input coupled to the drains of PMOS 41 and NMOS 42 in three-state circuit 410*d*, and an output driving a first local-oscillator signal (LO4). Accordingly, LO4 will be driven high only when both inputs to AND gate 430*d* are driven high, i.e., when both node 402 and 401 are low. Thus, LO4 will have a twenty-five percent duty cycle at a frequency that is half of the frequency of CLK.

Figure 5:
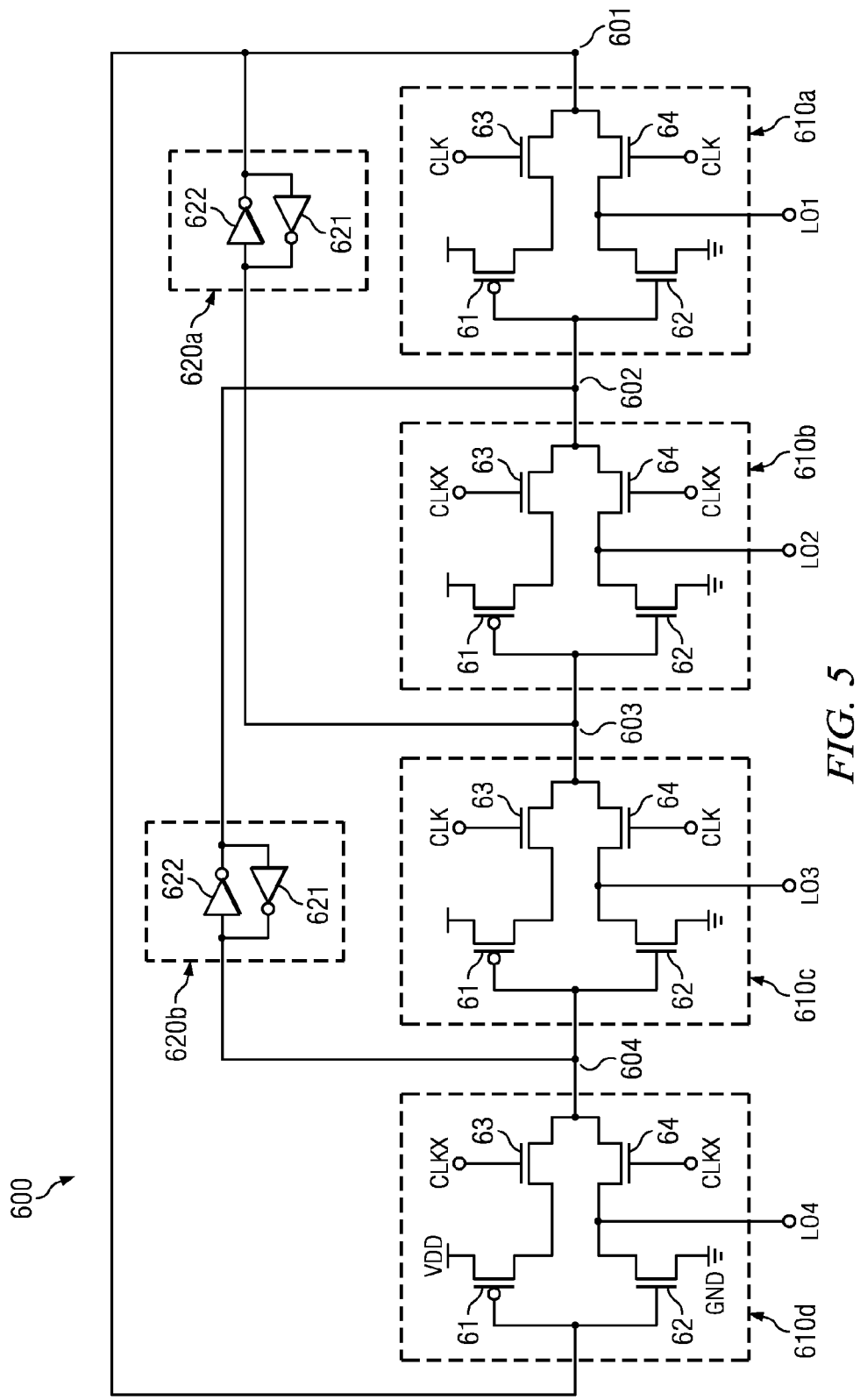
FIG. 5 illustrates a schematic diagram of an example frequency divider, in accordance with certain embodiments of the present disclosure.

FIG. 5 illustrates a schematic diagram of a frequency divider 600 that may provide a twenty-five percent duty cycle in accordance with certain embodiments of the present invention. Frequency divider 600 may include four three-state circuits 610*a-d* and two latches 620*a-b*. Three-state circuit 610*d* may have a loop input coupled to the loop output of three-state circuit 610*a* at node 601. Three-state circuit 610*c* may have a loop input coupled to the loop output of three-state circuit 610*d* at node 604. Three-state circuit 610*b* may have a loop input coupled to the loop output of three-state circuit 610*c* at node 603. Three-state circuit 610*a* may have a loop input coupled to the loop output of three-state circuit 610*b* at node 602. Latch 620*a* may have a first terminal coupled to node 601 and a second terminal coupled to node 603, and latch 620*b* may have a first terminal coupled to node 604 and a second terminal coupled to node 602.

As shown in FIG. 5, each of the three-state circuits 610*a-d* may include PMOS 61, NMOS 62, pass gate 63, and pass gate 64. PMOS 61 may have a gate coupled to the loop input of the three-state circuit 610, a source tied to a high potential power supply (VDD), and a drain coupled to the first conducting terminal of pass gate 63. NMOS 62 may have a gate coupled to the loop input of the three-state circuit 610, a source tied to a low potential power supply (GND), and a drain coupled to the first conducting terminal of pass gate 64. Unlike PMOS 41 and NMOS 42 in three-state circuit 410 as illustrated in FIG. 3, the drain of PMOS 61 is not directly coupled to the drain of NMOS 62. The second conducting terminal of pass gate 63 is coupled to the second conducting terminal of pass gate 64 at the loop output of the three-state circuit 610. As illustrated in FIG. 5, pass gate 63 may include an NMOS. In some alternative embodiments, pass gate 63 may include any other suitable means for passing an electrical signal dependent on a control signal. For example, in some alternative embodiments, pass gate 63 may include a PMOS configured to pass an electrical signal from a first conducting terminal to a second conducting terminal dependent on a voltage applied to the gate of the PMOS. Similarly, as illustrated in FIG. 5, pass gate 64 may include an NMOS. In some alternative embodiments, pass gate 64 may include any other suitable means for passing an electrical signal dependent on a control signal. For example, in some alternative embodiments, pass gate 64 may include a PMOS configured to pass an electrical signal from a first conducting terminal to a second conducting terminal dependent on a voltage applied to the gate of the PMOS.

Three-state circuit 610 may have three output states. Three-state circuit 610 may drive its loop output high when its loop input is low and pass gate 63 is on, it may drive the loop output low when its loop input is high and pass gate 64 is on, and it may force the loop output into a high impedance state when pass gate 63 and pass gate 64 are off.

Each latch 620 may include two cross-coupled inverters, inverter 621 and inverter 622. The term cross-coupled means, for the purposes of this invention, that the input of inverter 621 may be coupled to the output of inverter 622, and the input of inverter 622 may be coupled to the output of inverter 621. Inverters 621 and 622 may include any system, device or apparatus configured to invert a digital signal driven on its input. Latch 620 may be configured to be subservient when the terminals of latch 620 are driven high or low by loop outputs of the respective three-state circuits 610 and to latch the states of the loop outputs of the respective three-state circuits when the respective three-state circuits are in high impedance mode. For example, inverters 621 and 622 may include semiconductor transistors which are sized to have low transconductances as compared to the PMOS 61, NMOS 62, pass gate 63, and pass gate 64 in three-state circuit 610. Thus, when three-state circuit 610 and latch 620 are driving a node in opposite directions, the three-state circuit 610 may be dominant and may flip the state of the latch 620 so that the latch also drives the terminal in the same direction as the three-state circuit 610.

As shown in FIG. 5, the three-state circuits 610a-d are configured to receive a clock signal (CLK) and an inverted clock signal (CLKX).

Three-state circuits 610a and 610c are configured to actively drive nodes 601 and 603 respectively during a first phase of the clock cycle, i.e., when CLK is high and CLKX is low, and to place their respective loop outputs into a high impedance state during the second phase of the clock cycle, i.e., when CLK is high and CLKX is low. On the other hand, three-state circuits 610b and 610d are configured to actively drive nodes 602 and 604 respectively during the second phase of the clock cycle, i.e., when CLK is low and CLKX is high, and to place their respective loop outputs into a high impedance state during the first phase of the clock cycle, i.e., when CLK is high and CLKX is low. Though the first phase of the clock cycle is described above as when CLK is high and CLKX is low and the second phase of the clock cycle is described above as when CLK is low and CLKX is high, in some alternative embodiments the first phase of the clock cycle may be when CLK is low and CLKX is high, and the second phase of the clock cycle may be when CLK is high and CLKX is low.

Figure 6:
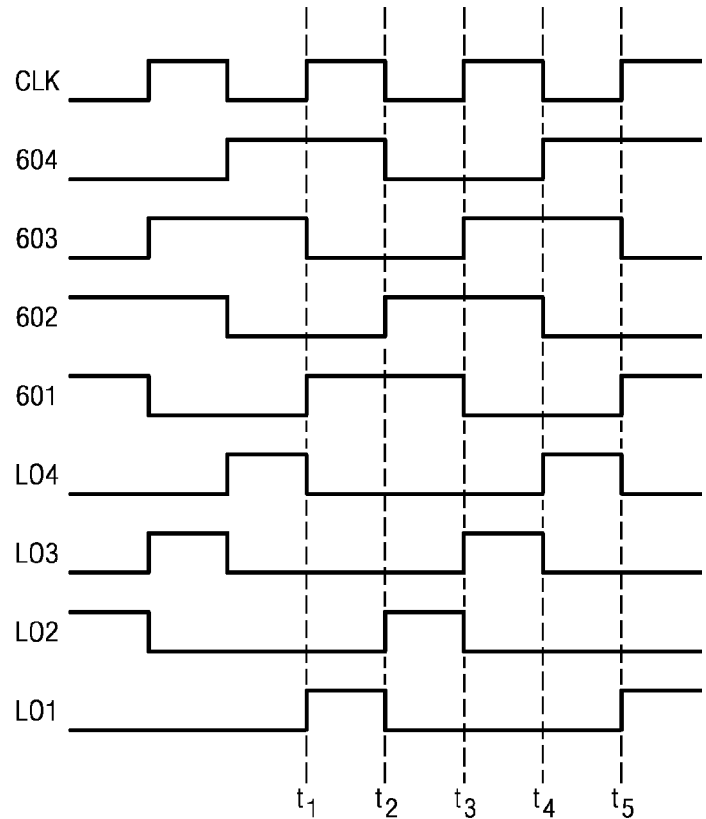
FIG. 6 illustrates a graph of example waveforms over time for selected signals at nodes of the frequency divider depicted in FIG. 5, in accordance with certain embodiments of the present disclosure.

As shown in FIG. 6, the alternating driving states and high impedance states of the four three-state circuits 610a-d connected in a loop may divide the frequency of the CLK and CLKX signals at nodes 604, 603, 602, and 601.

When CLK goes high (and CLKX goes low) at time $t_1$, three-state circuits 610d and 610b may enter high impedance state, but the values at node 604 and 602 may be held steady by latch 620b. At this time, three-state circuit 610c may invert the high signal at node 604 and drive node 603 low, and three-state circuit 610a may invert the low signal at node 602, drive node 601 high, and drive a first local-oscillator (LO1) signal high for as long as CLK is high and node 602 is low. Accordingly, the LO1 signal may be generated at one-half the frequency of CLK and with a twenty-five percent duty cycle from directly within the three-state circuit 610a, avoiding the need to combine signals from two or more three-state circuits at a current consuming logic gate to generate the LO1 signal.

When CLK goes low (and CLKX goes high) at time $t_2$, three-state circuits 610c and 610a may enter high impedance state, but the values at node 603 and 601 may be held steady by latch 620a. At this time, three-state circuit 610d may invert the high signal at node 601 and drive node 604 low, and three-state circuit 610b may invert the low signal at node 603, drive node 602 high, and drive a second local-oscillator signal (LO2) signal high for as long as CLK is low (and CLKX is high) and node 603 is low. Accordingly, the LO2 signal may be generated at one-half the frequency of CLK and with a twenty-five percent duty cycle from directly within the three-state circuit 610b, avoiding the need to combine signals from two or more three-state circuits at a current consuming logic gate to generate the LO2 signal.

When CLK goes high (and CLKX goes low) at time $t_3$, three-state circuits 610d and 610b may enter high impedance state, but the values at node 604 and 602 may be held steady by latch 620b. At this time, three-state circuit 610a may invert the high signal at node 602 and drive node 601 low, and three-state circuit 610c may invert the low signal at node 604 and drive node 603 high, and drive a third local-oscillator signal (LO3) high for as long as CLK is high (and CLKX is low) and node 604 is low. Accordingly, the LO3 signal may be generated at one-half the frequency of CLK and with a twenty-five percent duty cycle from directly within the three-state circuit 610c, avoiding the need to combine signals from two or more three-state circuits at a current consuming logic gate to generate the LO3 signal.

When CLK goes low (and CLKX goes high) at time $t_4$, three-state circuits 610c and 610a may enter high impedance state, but the values at node 603 and 601 may be held steady by latch 620a. At this time, three-state circuit 610b may invert the high signal at node 603 and drive node 602 low, and three-state circuit 610d may invert the low signal at node 601 and drive node 604 high, and drive a fourth local-oscillator signal (LO4) high for as long as CLK is low (and CLKX is high) and node 601 is low. Accordingly, the LO4 signal may be generated at one-half the frequency of CLK and with a twenty-five percent duty cycle from directly within the three-state circuit 610d, avoiding the need to combine signals from two or more three-state circuits at a current consuming logic gate to generate the LO4 signal.

At time $t_5$, the above described cycle for nodes 604, 603, 602, and 601, as well as signals LO4, LO3, LO2, and LO1, at times $t_1$-$t_4$ may begin to repeat itself.

As illustrated in FIG. 6, the respective loop outputs of each three-state circuit 610a-d may have a phase shift of ninety degrees from their respective loop inputs. Accordingly, counting from node 601, node 602 may be ninety degrees out of phase with node 601, node 603 may be one-hundred and eighty degrees out of phase with node 601, and node 604 may be two-hundred and seventy degrees out of phase with node 601.

Similarly, the local-oscillator signals may have a phase shift with respect to each other. Counting from the LO1 signal, the LO2 signal may be ninety degrees out of phase with the LO1 signal, the LO3 signal may be one-hundred and eighty degrees out of phase with the LO1 signal, and the LO4 signal may be two-hundred and seventy degrees out of phase with the LO1 signal. For the purposes of the present disclosure, any definition of a phase shift is only approximate, and may account for variances due to factors including but not limited to varying rise and fall times of various signals, temperature variation, and semiconductor processing variations. The phase shift of the four twenty-five percent duty cycle signals (LO1-LO4) may allow two or more of the twenty-five percent duty cycles to be used in conjunction with each other at the upconverter 208 or downconverter 228 to perform quadrature mixing. For example, instead of a mixer in downconverter 228 using a single fifty-percent duty cycle local-oscillator signal, the downconverter 228 may utilize both LO1 and LO2, which are ninety degrees out of phase with each other, to drive a mixer which implements a quadrature mixing scheme that has higher linearity.

Figure 7:
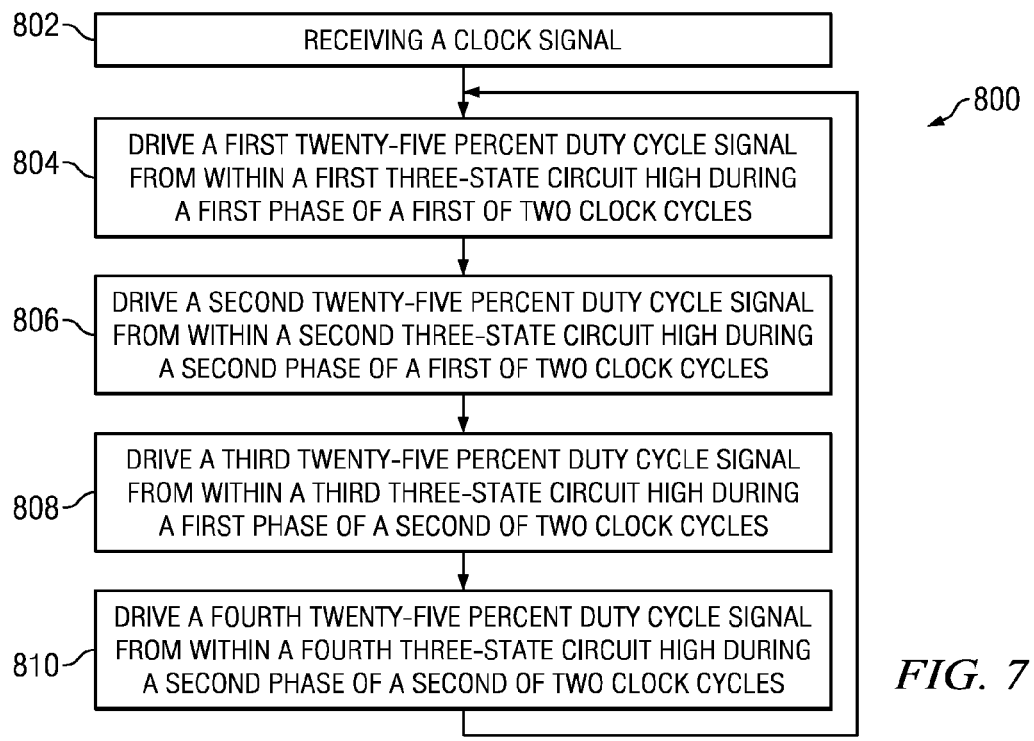
FIG. 7 illustrates a flow chart of a method for providing a frequency-divided twenty-five percent duty cycle signal, in accordance with certain embodiments of the present disclosure.

FIG. 7 depicts a flow chart of a method 800 for generating at least one frequency divided signal with a twenty-five percent duty cycle. According to one embodiment, method 800 may begin at step 802 by receiving a clock signal having repeating clock cycles, each cycle including a first phase and a second phase.

At step 804, a first three-state circuit 610a may drive a first twenty-five percent duty cycle signal (LO1) high during the first phase of the first of two clock cycles from directly within the first three-state circuit 610a.

At step 806, a second three-state circuit 610b may drive a second twenty-five percent duty cycle signal (LO2) high during the second phase of the first of two clock cycles from directly within the second three-state circuit 610b.

At step 808, a third three-state circuit 610c may drive a third twenty-five percent duty cycle signal (LO3) high during the first phase of the second of two clock cycles from directly within the third three-state circuit 610c.

At step 810, a fourth three-state circuit 610d may drive a fourth twenty-five percent duty cycle signal (LO4) high during the second phase of the second of two clock cycles from directly within the fourth three-state circuit 610d.

After step 810, the method may proceed back to step 804 and the steps 804-810 may repeat during the next set of two cycles of the clock signal.

Although FIG. 7 discloses a particular number of steps to be taken with respect to method 800, method 800 may be executed with greater or lesser steps than those depicted in FIG. 7. In addition, although FIG. 7 discloses a certain order of steps to be taken with respect to method 800, the steps comprising method 800 may be completed in any suitable order.

Although the present disclosure has been described with several embodiments, various changes and modifications may be suggested to one skilled in the art. It is intended that the present disclosure encompass such changes and modifications as fall within the scoped of the appended claims.

What is claimed is:

1. A frequency divider, comprising:
an input configured to receive a clock signal, each cycle of the clock signal including a first phase and a second phase;
a plurality of latches; and
a plurality of three-state circuits wherein a first of the plurality of three-state circuits is configured to drive a first twenty-five percent duty cycle signal from within the first three-state circuit high during a first phase of a first of two clock cycles.

2. A frequency divider according to claim 1, wherein:
a second of the plurality of three-state circuits is configured to drive a second twenty-five percent duty cycle signal from within the second three-state circuit high during a second phase of the first of two clock cycles;
a third of the plurality of three-state circuits is configured to drive a third twenty-five percent duty cycle signal from within the third three-state circuit high during a first phase of a second of two clock cycles; and
a fourth of the plurality of three-state circuits is configured to drive a fourth twenty-five percent duty cycle signal from within the fourth three-state circuit high during a second phase of the second of two clock cycles.

3. A frequency divider according to claim 2, wherein:
a loop input of the fourth three-state circuit is coupled to a loop output of the first three-state circuit and a first terminal of a first latch of the plurality of latches;
a loop input of the third three-state circuit is coupled to a loop output of the fourth three-state circuit and a first terminal of a second latch of the plurality of latches;
a loop input of the second three-state circuit is coupled to a loop output of the third three-state circuit and a second terminal of the first latch; and
a loop input of the first three-state circuit is coupled to a loop output of the second three-state circuit and a second terminal of the second latch.

4. A frequency divider according to claim 3, wherein:
the first latch comprises a first inverter cross-coupled with a second inverter; and
the second latch comprises a first inverter cross-coupled with a second inverter.

5. A frequency divider according to claim 4, wherein:
the first latch is configured to be subservient when the loop input of the second three-state circuit is driven by the loop output of the third three-state circuit and the loop input of the fourth three-state circuit is driven by the loop output of the first three-state circuit and to latch the loop input of the second three-state circuit and the loop input of the fourth three state circuit when the loop output of the third three-state circuit and the loop output of the first three-state circuit are in a high-impedance state; and
the second latch is configured to be subservient when the loop input of the first three-state circuit is driven by the loop output of the second three-state circuit and the loop input of the third three-state circuit is driven by the loop output of the fourth three-state circuit and to latch the loop input of the first three-state circuit and the loop input of the third three-state circuit when the loop output of the second three-state circuit and the loop output of the fourth three-state circuit are in a high-impedance state.

6. A frequency divider according to claim 1, wherein the first three-state circuit comprises:

a p-type metal-oxide semiconductor transistor (PMOS) having a gate coupled to a loop input of the first three-state circuit and a source coupled to a high potential power supply;

an n-type metal-oxide semiconductor transistor (NMOS) having a gate coupled to the loop input of the first three-state circuit and a source coupled to a low potential power supply;

a first pass gate having a first conducting terminal coupled to a drain of the PMOS and a second conducting terminal coupled to a loop output of the first three-state circuit; and a second pass gate having a first conducting terminal coupled to a drain of the NMOS and a second conducting terminal coupled the loop output of the first three-state circuit.

7. A frequency divider according to claim 6, wherein the drain of the PMOS is not directly coupled to the drain of the NMOS.

8. A frequency divider according to claim 7, wherein:
the first pass gate comprises a PMOS; and
the second pass gate comprises an NMOS.

9. A frequency divider according to claim 7, wherein:
the first pass gate comprises an NMOS; and
the second pass gate comprises an NMOS.

10. A frequency divider according to claim 7, wherein:
the first pass gate comprises a PMOS; and
the second pass gate comprises a PMOS.

11. A receiver, comprising:
a downconverter configured to downconvert a radio-frequency (RF) signal;
a local oscillator circuit configured to drive at least one mixer within the downconverter, the local oscillator circuit comprising:
an oscillator configured to generate a clock signal, each cycle of the clock signal having a first phase and a second phase; and
a frequency divider comprising:
an input configured to receive the clock signal;
a plurality of latches; and
a plurality of three-state circuits wherein a first of the plurality of three-state circuits is configured to drive a first twenty-five percent duty cycle signal from within the first three-state circuit high during a first phase of a first of two clock cycles.

12. A receiver according to claim 11, the frequency divider further comprising:
a second of the plurality of three-state circuits is configured to drive a second twenty-five percent duty cycle signal from within the second three-state circuit high during a second phase of the first of two clock cycles;
a third of the plurality of three-state circuits is configured to drive a third twenty-five percent duty cycle signal from within the third three-state circuit high during a first phase of a second of two clock cycles; and
a fourth of the plurality of three-state circuits is configured to drive a fourth twenty-five percent duty cycle signal from within the fourth three-state circuit high during a second phase of the second of two clock cycles.

13. A receiver according to claim 12, wherein:
a loop input of the fourth three-state circuit is coupled to a loop output of the first three-state circuit and a first terminal of a first latch of the plurality of latches;
a loop input of the third three-state circuit is coupled to a loop output of the fourth three-state circuit and a first terminal of a second latch of the plurality of latches;

a loop input of the second three-state circuit is coupled to a loop output of the third three-state circuit and a second terminal of the first latch; and
a loop input of the first three-state circuit is coupled to a loop output of the second three-state circuit and a second terminal of the second latch.

14. A receiver according to claim 13, wherein:
the first latch comprises a first inverter cross-coupled with a second inverter, the first latch configured to be subservient when the loop input of the second three-state circuit is driven by the loop output of the third three-state circuit and the loop input of the fourth three-state circuit is driven by the loop output of the first three-state circuit and to latch the loop input of the second three-state circuit and the loop input of the fourth three state circuit when the loop output of the third three-state circuit and the loop output of the first three-state circuit are in a high-impedance state; and the second latch comprises a first inverter cross-coupled with a second inverter, the second latch configured to be subservient when the loop input of the first three-state circuit is driven by the loop output of the second three-state circuit and the loop input of the third three-state circuit is driven by the loop output of the fourth three-state circuit and to latch the loop input of the first three-state circuit and the loop input of the third three-state circuit when the loop output of the second three-state circuit and the loop output of the fourth three-state circuit are in a high-impedance state.

15. A receiver according to claim 11, wherein the first three-state circuit comprises:
a p-type metal-oxide semiconductor transistor (PMOS) having a gate coupled to a loop input of the first three-state circuit and a source coupled to a high potential power supply;
an n-type metal-oxide semiconductor transistor (NMOS) having a gate coupled to the loop input of the first three-state circuit, and a source coupled to a low potential power supply;
a first pass gate having a first conducting terminal coupled to a drain of the PMOS and a second conducting terminal coupled to a loop output of the first three-state circuit; and
a second pass gate having a first conducting terminal coupled to a drain of the NMOS and a second conducting terminal coupled the loop output of the first three-state circuit.

16. A receiver according to claim 15, wherein the drain of the PMOS is not directly coupled to the drain of the NMOS.

17. A receiver according to claim 11, wherein the downconverter is configured to perform quadrature mixing.

18. A method for generating at least one frequency-divided twenty-five percent duty cycle signal comprising:
receiving a clock signal, each cycle of the clock signal having a first phase and a second phase; and
driving a first twenty-five percent duty cycle output from within a first three-state circuit high during a first phase of a first of two clock cycles.

19. A method according to claim 18, further comprising:
driving a second twenty-five percent duty cycle output from within a second three-state circuit high during a second phase of the first of two clock cycles;
driving a third twenty-five percent duty cycle output from within a third three-state circuit high during a first phase of a second of two clock cycles; and driving a fourth twenty-five percent duty cycle output from within a fourth three-state circuit high during a second phase of the second of two clock cycles.

20. A method according to claim 18, further comprising generating a frequency-divided signal having a low state during the first clock cycle of two clock cycles and a high state during the second clock cycle of two clock cycles.

21. A method according to claim 20, further comprising inverting the low state of the frequency-divided signal to create an inverted frequency-divided signal at a first node within the first three-state circuit during the first of two clock cycles.

22. A method according to claim 21, further comprising passing the inverted frequency-divided signal at the first node within the first three-state circuit to a second node within the first three-state circuit during the first phase of the first out of two cycles.

\* \* \* \* \*